United States Patent
Machida et al.

(10) Patent No.: US 6,953,754 B2
(45) Date of Patent: Oct. 11, 2005

(54) FUNCTIONAL DEVICE AND METHOD OF MANUFACTURING THE SAME

(75) Inventors: Akio Machida, Kanagawa (JP); Dharam Pal Gosain, Kanagawa (JP); Setsuo Usui, Kanagawa (JP)

(73) Assignee: Sony Corporation, Tokyo (JP)

( * ) Notice: Subject to any disclaimer, the term of this patent is extended or adjusted under 35 U.S.C. 154(b) by 109 days.

(21) Appl. No.: 10/478,888

(22) PCT Filed: Jun. 4, 2002

(86) PCT No.: PCT/JP02/05489

§ 371 (c)(1),
(2), (4) Date: Nov. 24, 2003

(87) PCT Pub. No.: WO02/099892

PCT Pub. Date: Dec. 12, 2002

(65) Prior Publication Data

US 2004/0157470 A1 Aug. 12, 2004

(30) Foreign Application Priority Data

Jun. 4, 2001 (JP) .................................. P2001-168756

(51) Int. Cl.⁷ .............................................. H01L 21/31
(52) U.S. Cl. ........................ 438/763; 438/761; 257/347
(58) Field of Search ................................ 438/166, 761, 438/763; 257/347

(56) References Cited

U.S. PATENT DOCUMENTS 5,646,432 A * 7/1997 Iwaki et al. ................. 257/347
5,811,348 A 9/1998 Matsushita .................. 438/455
6,570,223 B1 * 5/2003 Machida et al. ............ 257/347
6,661,027 B1 * 12/2003 Machida et al. ............ 257/79
6,716,664 B2 * 4/2004 Machida et al. ............ 438/99
2001/0015256 A1 * 8/2001 Yamazaki et al. .......... 156/289

FOREIGN PATENT DOCUMENTS

| JP | 04-33327 | 2/1992 |
| JP | 05-152204 | 6/1993 |
| JP | 08-186267 | 7/1996 |
| JP | 10-150200 | 6/1998 |
| JP | 11-163363 | 6/1999 |
| JP | 2001-196597 | 7/2001 |

* cited by examiner

Primary Examiner—Christian Wilson
(74) Attorney, Agent, or Firm—Sonnenschein, Nath & Rosenthal LLP

(57) ABSTRACT

The invention provides a functional device having no cracks and capable of delivering good functional characteristics and a method of manufacturing the same. A functional layer (14) is formed by crystallizing an amorphous silicon layer as a precursor layer by laser beam irradiation. A laser beam irradiation conducts heat up to a substrate (11) to cause it to try to expand; a stress to be produced by the difference in thermal expansion coefficient between the substrate (11) and the functional layer (14) is shut off by an organic polymer layer (12) lower in thermal expansion coefficient than the substrate (11), thereby causing no cracks nor separations in the functional layer (14). The organic polymer layer (12) is preferably made of an acrylic resin, an epoxy resin, or a polymer material containing these that is deformed by an optical or thermal process to undergo a three-dimensional condensation polymerization, for higher compactness and hardness. Inserting a metal layer and an inorganic heat resistant layer between the substrate (11) and the functional layer (14) will permit a more powerful laser irradiation.

42 Claims, 6 Drawing Sheets

FUNCTIONAL DEVICE AND METHOD OF MANUFACTURING THE SAME

BACKGROUND OF THE INVENTION

The present invention relates to a functional device having a functional layer, such as a thin film transistor, a dielectric capacitor, or a solar battery, and a method of manufacturing the same.

Since the pn junction of a hydrogenated amorphous silicon was developed in 1976, the hydrogenated amorphous silicon has been being actively studied. The hydrogenated amorphous silicon has a structure in which a dangling bond in a network made of silicon is terminated by hydrogen or fluorine, and its film can be formed at a low temperature equal to or lower than 300° C. Consequently, the film can be formed on a cheap glass substrate. A study is being made to apply the hydrogenated amorphous silicon to a functional device such as a thin film transistor (TFT), a solar battery, or an optical sensor.

However, when the hydrogenated amorphous silicon is used as it is, in the case of a TFT, only carrier mobility as low as about 0.1 to 0.5 $cm^2/V \cdot s$ can be obtained. In the case of a solar battery, there are drawbacks such that doping efficiency is lower as compared with the case of using polysilicon, and photoelectric conversion efficiency deteriorates due to an increase in series resistance. In recent years, a method of solving the problems by irradiating amorphous silicon formed on a glass substrate with an energy beam such as exicimer laser beam so as to be crystallized is being studied. Recently, crystallization of not only semiconductors but also oxides performed by irradiation of an energy beam is also being studied.

In the functional devices, a substrate for supporting a functional layer made of silicon, oxide, or the like is required to be light, shock-resistant, and flexible so as not to be broken when some stress is applied. Conventionally, a silicon substrate, a glass substrate, or the like is used. Recently, it is proposed to use a substrate made of an organic material such as polyethylene terephthalate (PET) which is lighter and more shock-resistant (refer to Japanese Unexamined Patent Application Nos. 8-186267, 10-144930, and 10-144931).

An organic material substrate has, however, a thermal expansion coefficient higher than that of a glass substrate or a silicon substrate. For example, as shown in FIG. 9, when a functional layer 103 is crystallized by irradiating a laser beam LB as an energy beam, problems arises such that a substrate 101 expands by a heat transmitted via an inorganic heat resistant layer 102 to the substrate 101, a very large stress instantaneously works on the functional layer 103, a crack occurs and, in a worse case, peeling occurs. In this case, when the inorganic heat resistant layer 102 for suppressing thermal conduction from the functional layer 103 is formed with a thickness of 500 nm or more, expansion of the substrate 101 is suppressed and peeling of the functional layer 103 can be suppressed to a certain extent. However, even small deformation of the substrate 101 causes a crack in the inorganic heat resistant layer 102 on the substrate 101, and peeling occurs from the interface. In the case of manufacturing a functional device by using the organic material substrate, therefore, sufficient characteristics and reliability cannot be obtained.

The invention has been achieved in consideration of the problems and its object is to provide a functional device having no crack and capable of delivering good functional characteristics and a method of manufacturing the same.

SUMMARY OF THE INVENTION

A functional device of the invention has a functional layer provided on one of faces of a substrate and comprises: an inorganic heat resistant layer which consists of one or a plurality of layers provided between the substrate and the functional layer; and an organic polymer layer lower in thermal expansion coefficient than the substrate provided between the inorganic heat resistant layer and the substrate.

Another functional device according to the invention from which a substrate is removed after the functional layer is provided on one of faces of the substrate, comprises: an organic polymer layer lower in thermal expansion coefficient than the substrate provided on one of faces of the functional layer; and an inorganic heat resistant layer which consists of one or a plurality of layers provided between the organic polymer layer and the functional layer.

A method of manufacturing a functional device according to the invention in which a functional layer is provided on a substrate, comprises: a step of forming an organic polymer layer having a thermal expansion coefficient lower than that of the substrate on the substrate; a step of forming an inorganic heat resistant layer which consists of one or a plurality of layers on the organic polymer layer; and a step of forming the functional layer on the inorganic heat resistant layer.

In the functional device according to the invention and the method of manufacturing the same, stress caused by the thermal expansion of the substrate can be shut off by the organic polymer layer which is provided between the substrate and the functional layer and having the thermal expansion coefficient lower than that of the substrate, so that occurrence of cracks and peeling in the functional layer can be prevented.

In another functional device according to the invention, the organic polymer layer having a thermal expansion coefficient lower than that of the substrate is provided. Thus, occurrence of a crack in the functional layer due to the difference in the thermal expansion coefficient can be prevented.

Further, in the functional device according to the invention and the method of manufacturing the same, it is preferable to provide the warp suppression layer on the face of the substrate opposite to the face on which the functional layer is provided in order to suppress a warp caused by thermal deformation of the substrate. The warp suppression layer may be a composite layer of a polymer layer made of an organic polymer material and an inorganic heat resistant layer which consists of one or two or more layers. Alternately, the warp suppression layer may be constructed only by the polymer layer made of an organic polymer material.

Other and further objects, features and advantages of the invention will appear more fully from the following description.

DETAILED DESCRIPTION OF THE PRESENTLY PREFERRED EMBODIMENTS

Embodiments of the invention will be described in detail hereinbelow with reference to the drawings.

First Embodiment

Figure 1:
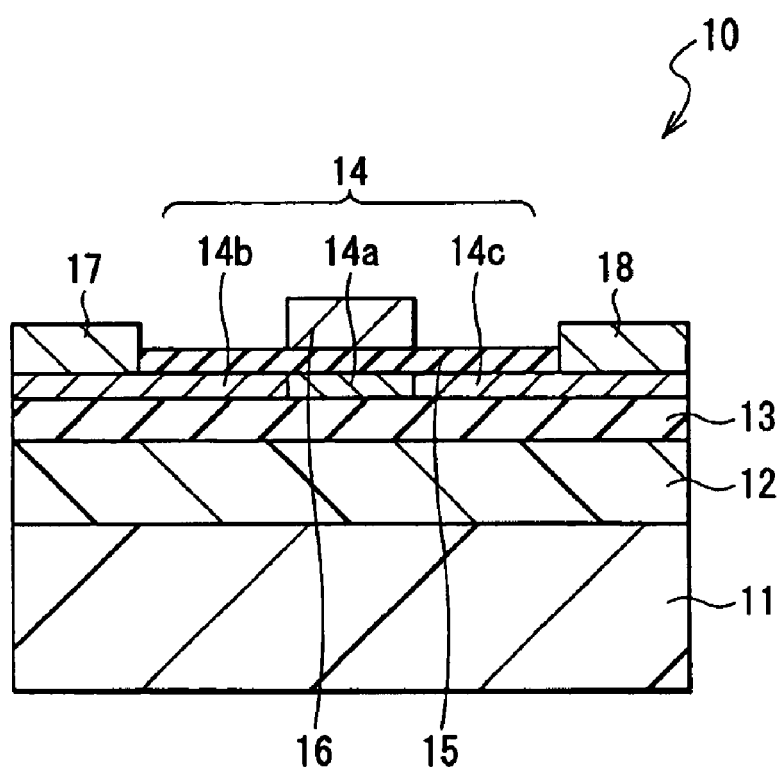
FIG. 1 is a cross section showing the configuration of a thin film transistor according to a first embodiment of the invention.

FIG. 1 shows a sectional configuration of a thin film transistor 10 according to a first embodiment of the invention. The thin film transistor 10 has, for example, an organic polymer layer 12 and an inorganic heat resistant layer 13 which are stacked in this order on a substrate 11. The thickness increases in accordance with the order of the inorganic heat resistant layer 13, the organic polymer layer 12, and the substrate 11. On the inorganic heat resistant layer 13, a channel area 14a, a source area 14b, and a drain area 14c are formed as a functional layer 14. The source area 14b and the drain area 14c are provided so as to be isolated from each other and adjacent to the channel area 14a. A gate electrode 16 is formed on the channel area 14a via an insulating film 15. A source electrode 17 is electrically connected to the source area 14b, and a drain electrode 18 is electrically connected to the drain area 14c.

The substrate 11 is made of, for example, an organic material. Preferable organic materials for forming the substrate 11 are polymer materials such as polyesters e.g. PET (polyethylene terephthalate), polyethylene naphthalate, or polycarbonate, polyolefins such as polypropylene, polyphenylene sulfides such as polyphenylene sulfide, polyamides, aromatic polyamides, polyether ketones, polyimides, acrylic resin, and PMMA (polymethyl methacrylate). Particularly, a general plastic substrate made of polyethylene terephthalate, acetate, polyphenylene sulfide, polycarbonate, PES (polyether sulfone), polystyrene, nylon, polypropylene, polyvinyl chloride, acrylic resin, PMMA, or the like can be suitably used.

The substrate 11 is preferably thin and has a thickness of, for example, about 200 μm to give the device flexibility and to reduce the size of the device.

The organic polymer layer 12 has a thickness of, for example, about 10 μm and is made of an organic material having a thermal expansion coefficient higher than that of the substrate 11. For example, when a plastic board is used as the substrate 11, it is preferable to use a so-called hard coating material for the plastic board, which maintains some hardening up to 200° C. of relatively high temperature and has denseness and hardness. Examples of such a coating material are an acrylic resin, an epoxy resin, and polymer materials containing any of the resins thereof, each of which is bonded by three-dimensional condensation polymerization that occurs when the material is deformed by an optical or thermal process.

Examples of the coating material containing an acrylic resin are a polymer material containing an acrylic resin and a composite polymer plastic material containing an acrylic resin and another resin. Examples of such a coating material which is preferably used are various polyfunctional acrylate compounds such as ethylene glycol di(meth)acrylate, neopentyl glycol di(meth)acrylate, bisphenol-A di(meth) acrylate, trimethylolpropane tri(meth)acrylate, pentaerythritol tri(meth)acylate, and dipentaerythritol, bifunctional acrylate compounds prepared by causing a reaction between 2,2-bis(4'-hydroxyphenyl) hexafluoro propane or alkylene glycol ether and isocyanate alkyl (meth)acrylate, and the like. The kind of a comonomer to be subjected to copolymerization varies according to the application field, and any copolymerizable monomer can be used.

Each of the coating materials is usually made of a monomer having a molecular weight of about 100 to 1000 and having a single unsaturated site or two, three, or a number of unsaturated sites. With respect to the composition of the coating material, preferably, 99 to 100 percent by weight is reactive components and a solid material. More preferably, 99.9 to 100 percent by weight is reactive components and a solid material. Most preferably, 100 percent by weight is reactive components and a solid material. Solid materials include a polymer material and a nonvolatile solid material such as colloidal silica. One of proper polymer materials is cellulose acetate butyrate. A coating material which can be converted to a solid matter by 100% when exposed to ultraviolet rays is preferable. In each of the materials, a photopolymerization initiator of an amount necessary to enable the coating material to be hardened by light irradiation is contained. Each of the materials may contain a predetermined amount of latent ultraviolet ray shielding material such as resorcinol monobenzoate.

Examples of the coating material containing an epoxy resin are an organic silicon compound, and a substance generically called an epoxy silane as the hydrolysate of the organic silicon compound. Examples of the coating material are γ-glycidoxypropyl trimethoxysilane, γ-glycidoxypropyl trietoxysilane, γ-glycidoxypropyl trimethoxy ethoxy silane, γ-glycidoxypropyl triacetoxysilane, β-(3,4-epoxycyclohexyl)ethyl trimethoxy silane, β-(3,4-epoxycyclohexyl)ethyl triethoxy silane, β-(3,4-epoxycyclohexyl)ethyl trimethoxy ethoxy silane, β-(3,4-epoxycyclohexyl)ethyl triacetoxy silane, γ-glycidoxypropyl dimethoxy methyl silane, γ-glycidoxypropyl diethoxy methyl silane, γ-glycidoxypropyl dimethoxy ethoxy methyl silane, γ-glycidoxypropyl diacetoxy methyl silane, β-(3,4-epoxycyclohexyl)ethyl dimethoxy methyl silane, β-(3,4-epoxycyclohexyl)ethyl diethoxy methyl silane, β-(3,4-epoxycyclohexyl)ethyl dimethoxy ethoxy methyl silane, β-(3,4-epoxycyclohexyl)ethyl diacetoxy methyl silane, γ-glycidoxypropyl dimethoxy ethyl silane, γ-glycidoxypropyl diethoxy ethyl silane, γ-glycidoxypropyl dimethoxy ethoxy ethyl silane, γ-glycidoxypropyl diacetoxy ethyl silane, γ-(3,4-epoxycyclohexyl)ethyl dimethoxy ethyl silane, β-(3,4-epoxycyclohexyl)ethyl diethoxy ethyl silane, β-(3,4-epoxycyclohexyl)ethyl dimethoxy ethoxy ethyl silane, β-(3,4-epoxycyclohexyl)ethyl diacetoxy ethyl silane, γ-glycidoxypropyl dimethoxy isopropyl silane, γ-glycidoxypropyl diethoxy isopropyl silane, γ-glycidoxypropyl dimethoxy ethoxy isopropyl silane, γ-glycidoxypropyl diacetoxy isopropyl silane, β-(3,4-epoxycyclohexyl)ethyl diethoxy isopropyl silane, β-(3,4-epoxycyclohexyl)ethyl diethoxy isopropyl silane, β-(3,4-epoxycyclohexyl)ethyl dimethoxy ethoxy isopropyl silane, β-(3,4-epoxycyclohexyl)ethyl diacetoxy isopropyl silane, γ-glycidoxypropyl methoxy dimethyl silane, γ-glycidoxypropyl ethoxy dimethyl silane, γ-glycidoxypropyl methoxy ethoxy dimethyl silane, γ-glycidoxypropyl acetoxy dimethyl silane, β-(3,4-epoxycyclohexyl)ethyl methoxy dimethyl silane, β-(3,4-epoxycyclohexyl)ethyl ethoxy dimethyl silane, β-(3,4-epoxycyclohexyl)ethyl methoxy ethoxy dimethyl silane, β-(3,4-epoxycyclohexyl)ethyl acetoxy dimethyl silane, γ-glycidoxypropyl methoxy diethyl silane, γ-glycidoxypropyl ethoxy diethyl silane, γ-glycidoxypropyl methoxy ethoxy diethyl silane, γ-glycidoxypropyl acetoxy diethyl silane, β-(3,4-epoxycyclohexyl)ethyl methoxy diethyl silane, β-(3,4-epoxycyclohexyl)ethyl ethoxy diethyl silane, β-(3,4-epoxycyclohexyl)ethyl methoxy ethoxy diethyl silane, β-(3,4-epoxycyclohexyl)ethyl acetoxy diethyl silane, γ-glycidoxypropyl methoxy di-isopropyl silane, γ-glycidoxypropyl ethoxy di-isopropyl silane, γ-glycidoxypropyl, methoxy ethoxy di-isopropyl silane, γ-glycidoxypropyl acetoxy di-isopropyl silane, β-(3,4-epoxycyclohexyl)ethyl methoxy di-isopropyl silane, β-(3,4-epoxycyclohexyl)ethyl ethoxy di-isopropyl silane, β-(3,4-epoxycyclohexyl)ethyl methoxy ethoxy di-isopropyl silane, β-(3,4-epoxycyclohexyl)ethyl acetoxy di-isopropyl silane, γ-glycidoxypropyl methoxy ethoxy methyl silane, γ-glycidoxypropyl acetoxy methoxy methyl silane, γ-glycidoxypropyl acetoxy ethoxy methyl silane, β-(3,4-epoxycyclohexyl)ethyl methoxy ethoxy methyl silane, β-(3,4-epoxycyclohexyl)ethyl methoxy acetoxy methyl silane, β-(3,4-epoxycyclohexyl)ethyl ethoxy acetoxy methyl silane, γ-glycidoxypropyl methoxy ethoxy ethyl silane, γ-glycidoxypropyl acetoxy methoxy ethyl silane, γ-glycidoxypropyl acetoxy ethoxy ethyl silane, β-(3,4-epoxycyclohexyl)ethyl methoxy ethoxy ethyl silane, β-(3,4-epoxycyclohexyl)ethyl methoxy acetoxy ethyl silane, β-(3,4-epoxycyclohexyl)ethyl ethoxy acetoxy ethyl silane, γ-glycidoxypropyl methoxy ethoxy isopropyl silane, γ-glycidoxypropyl acetoxy methoxy isopropyl silane, γ-glycidoxypropyl acetoxy ethoxy isopropyl silane, β-(3,4-epoxycyclohexyl)ethyl methoxy ethoxy isopropyl silane, β-(3,4-epoxycyclohexyl)ethyl methoxy acetoxy isopropyl silane, β-(3,4-epoxycyclohexyl)ethyl ethoxy acetoxy isopropyl silane, glycidoxy methyl trimethoxysilane, glycidoxy methyl triethoxysilane, α-glycidoxy ethyl trimethoxysilane, α-glycidoxy methyl trimethoxysilane, β-glycidoxy ethyl trimethoxysilane, β-glycidoxy methyl trimethoxysilane, α-glycidoxypropyl trimethoxysilane, α-glycidoxypropyl triethoxysilane, β-glycidoxypropyl trimethoxysilane, β-glycidoxypropyl triethoxysilane, γ-glycidoxypropyl tripropoxysilane, γ-glycidoxypropyl tributoxy silane, γ-glycidoxypropyl triphenoxysilane, α-glycidoxy butyl trimethoxysilane, α-glycidoxy butyl triethoxysilane, β-glycidoxy butyl trimethoxysilane, β-glycidoxy butyl triethoxysilane, γ-glycidoxy butyl trimethoxysilane, γ-glycidoxy butyl triethoxysilane, (3,4-epoxycyclohexyl) methyl trimethoxysilane, (3,4-epoxycyclohexyl)methyl triethoxysilane, β-(3,4-epoxycyclohexyl)ethyl tripropoxysilane, β-(3,4-epoxycyclohexyl)ethyl triptoxysilane, β-(3,4-epoxycyclohexyl)ethyl triphenoxysilane, γ-(3,4-epoxycyclohexyl)propyl trimethoxysilane, γ-(3,4-epoxycyclohexyl)propyl triethoxysilane, δ-(3,4-epoxycyclohexyl)butyl trimethoxysilane, δ-(3,4-epoxycyclohexyl)butyl triethoxysilane, glycidoxy methyl methyl dimethoxysilane, glycidoxy methyl methyl diethoxysilane, α-glycidoxy ethyl methyl dimethoxysilane, α-glycidoxy ethyl methyl diethoxysilane, β-glycidoxy ethyl methyl dimethoxysilane, β-glycidoxy ethyl methyl diethoxysilane, α-glycidoxypropyl methyl dimethoxysilane, α-glycidoxypropyl methyl diethoxysilane, β-glycidoxypropyl methyl dimethoxysilane, β-glycidoxypropyl methyl diethoxysilane, γ-glycidoxypropyl methyl dimethoxysilane, γ-glycidoxypropyl methyl diethoxysilane, γ-glycidoxypropyl methyl dipropoxysilane, γ-glycidoxypropyl methyl dibutoxysilane, γ-glycidoxypropyl methyl dimethoxy ethoxysilane, γ-glycidoxypropyl methyl diphenoxysilane, γ-glycidoxypropyl ethyl dimethoxysilane, γ-glycidoxypropyl ethyl diethoxysilane, γ-glycidoxypropyl ethyl dipropoxysilane, γ-glycidoxypropyl vinyl dimethoxysilane, and γ-glycidoxypropyl vinyl diethoxysilane.

One of the coating materials may be used or, according to a purpose, a mixture of two or more kinds of the coating materials may be used. Any of the coating materials may be mixed with another silane compound. Examples of silane compounds are various trialkoxysilane, triacyloxysilane, or trialkoxy alkoxysilane compounds such as methyltrimethoxysilane, methyltriethoxysilane, vinyltrimethoxysilane, vinyltriethoxysilane, vinyltriacetoxysilane, vinyltrimethoxyethoxysilane, γ-methacryloxypropyl trimethoxy silane, aminomethyl trimethoxysilane, 3-aminopropyl trimethoxysilane, 3-aminopropyl triethoxy silane, phenyl trimethoxy silane, phenyl triethoxy silane, γ-chloropropyl trimethoxy silane, γ-mercapto propyl triethoxy silane, and 3,3,3-trifluoro propyl trimethoxy silane, dialkoxysilane compounds such as dimethyl dimethoxysilane, diphenyl dimethoxysilane, methyl phenyl dimethoxysilane, methyl vinyl dimethoxysilane, and dimethyl diethoxysilane, and tetrafunctional silane compounds such as methyl silicate, ethyl silicate, isopropyl silicate, n-propyl silicate, n-butyl silicate, t-butyl silicate, and sec-butyl silicate.

A number of so-called hard coating materials exist such as a polymer material of an acrylic resin which is highly dense and very hard achieved by bonding by three-dimensional condensation polymerization, a plastic material of a composite polymer containing an acrylic resin and another resin, and a hard coating material made of an organic silicide and an epoxy resin of the hydrolyte of the organic silicide. Obviously, the above-described group of materials are just examples.

In a method of forming the organic polymer layer 12, as necessary, fillers and water or organic solvent are mixed with the acrylic resin, epoxy resin, or a polymer material containing any of the resins, and dispersed by a paint shaker, a sand mill, a pearl mill, a ball mill, an attriter, a rolling mill, a high-speed impeller disperser, a jet mill, a high-speed impact mill, an ultrasonic disperser, or the like, thereby obtaining a coating material.

The coating material is applied so as to form a single layer or multiple layers on one of the faces or both faces of the substrate 11 by using a coating method such as air doctor coating, blade coating, knife coating, reverse coating, transfer roll coating, gravure roll coating, kiss-roll coating, cast coating, spray coating, slot orifice coating, calender coating, electrodeposition coating, dip coating, or die coating, or a printing method of, for example, letterpress printing such as flexographic printing, intaglio printing such as direct gravure printing or offset gravure printing, plate printing such as offset printing, or stencil printing such as screen printing. In the case where the coating material contains a solvent, after application, the coating material is thermally dried. Subsequently, the coating material applied on the substrate is heated or irradiated with an energy beam, for example, ultraviolet rays from an ultraviolet lamp so as to be set. In the case of using ultraviolet rays as the energy beam, a photopolymerization initiator is necessary.

The inorganic heat resistant layer 13 has a thickness of, for example, about 300 nm and is made of a material having thermal conductivity lower than that of the functional layer 14 and having a thermal expansion coefficient lower than that of the organic polymer layer 12. In this case, the inorganic heat resistant layer 13 is made of an oxide such as silicon oxide ($SiO_x$), a nitride such as silicon nitride ($SiN_x$), an oxynitride such as silicon oxynitride ($SiO_xN_y$), or the like or may have a multilayer structure of those materials. An inorganic carbide such as silicon carbon (SiC), a carbon material such as DLC (Diamond Like Carbon), or the like may be also used.

As described above, the thermal coefficients of expansion are, from the lowest to the highest, the inorganic heat resistant layer 13, organic polymer layer 12, and substrate 11.

Each of the channel area 14a, source area 14b, drain area 14c is made of, for example, polycrystalline silicon (polysilicon), so that high carrier mobility can be obtained. The polycrystal includes so-called quasi-single crystal described in the specification of Japanese Patent Application No. 9-30552. The quasi-single crystal is constructed by a plurality of crystal grains each of which is almost a single crystal. The crystal grains are priority-oriented in a direction of one plane and neighboring crystal grains are lattice-aligned at least in a part of the grain boundary.

In each of the source area 14b and the drain area 14c, for example, an n-type impurity such as phosphorus (P) is doped. Each of the channel area 14a, source area 14b, and drain area 14c has a thickness of, for example, about 30 nm. The insulating film 15 is made of, for example, silicon oxide. Each of the gate electrode 16, source electrode 17, and drain electrode 18 is made of, for example, aluminum (Al).

Figure 2A:
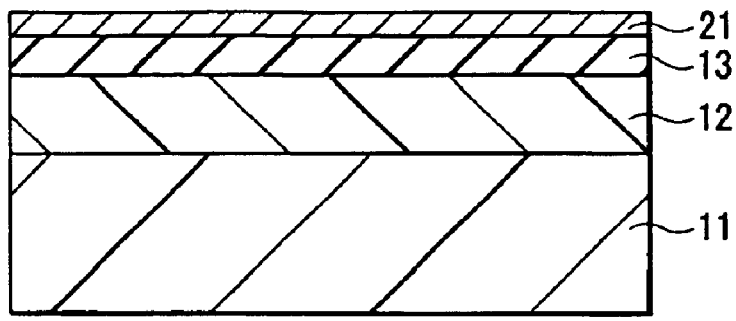
FIGS. 2A, 2B, and 2C are cross sections each showing a manufacturing process of the thin film transistor shown in FIG. 1.
Figure 2B:
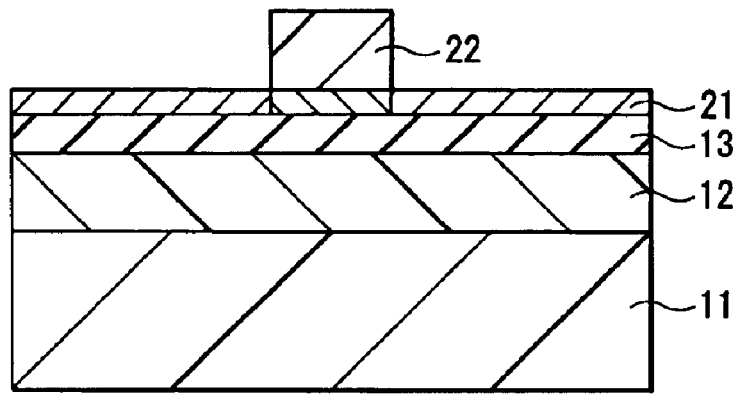
Figure 2C:
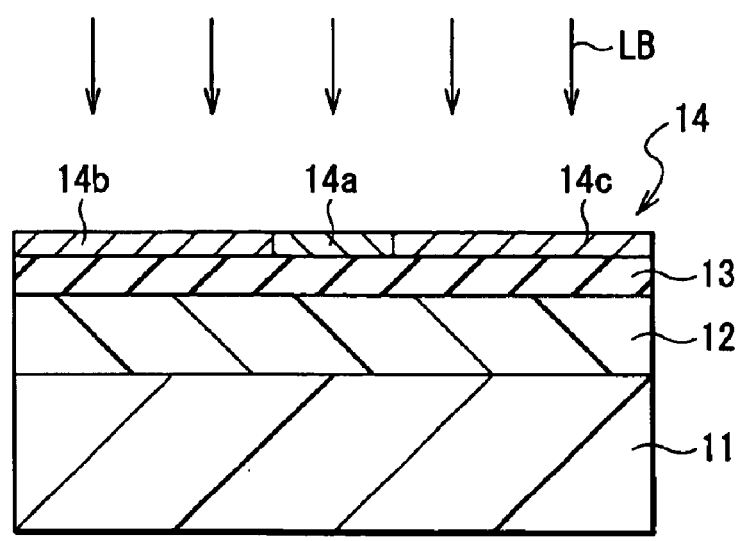

Referring to FIGS. 2A, 2B, and 2C, a method of manufacturing the thin film transistor 10 will now be described.

First, as shown in FIG. 2A, on the substrate 11, a polymer material containing an acrylic resin, for example, dipentaerithritol is dispersed by a paint shaker, thereby obtaining a coating material. The coating material is coated by air doctor coating. After that, the coating material coated on the substrate is set by being heated or irradiated with an energy beam, for example, ultraviolet rays from an ultraviolet lamp by using a photopolymerization initiator, thereby forming the organic polymer layer 12. Subsequently, for example, the substrate 11 on which the organic polymer layer 12 is formed is stamped into a predetermined shape, washed, and dried. Then, the inorganic heat resistant layer 13 is formed on the organic polymer layer 12 by, for example, reactive sputtering. After that, an amorphous silicon layer 21 is formed as a precursor layer of the functional layer 14 on the inorganic heat resistant layer 13 by, for example, sputtering.

After forming the amorphous silicon layer 21, for example, as shown in FIG. 2B, a photoresist film 22 having openings corresponding to areas which become the source area 14b and the drain area 14c is formed on the amorphous silicon layer 21. For example, by using the photoresist film 22 as a mask, the amorphous silicon layer 21 is exposed to an atmosphere containing an ionized gas of phosphine ($PH_3$) to dope phosphorus to the areas which become the source area 14b and the drain area 14c. After doping phosphorus, the photoresist film 22 is removed.

After removing the photoresist film 22, for example, as shown in FIG. 2C, the amorphous silicon layer 21 is irradiated with a laser beam LB so as to be heated in a nitrogen gas ($N_2$) atmosphere. By the operation, the amorphous silicon layer 21 is crystallized, and the functional layer 14, that is, the channel area 14a, source area 14b, and drain area 14c are formed. In this case, as the laser beam LB, it is preferable to use an excimer laser beam. The wavelength may be any of 350 nm of XeF, 308 nm of XeCl, 248 nm of KrF, 193 nm of ArF, and the like. In the case of using a laser beam of a short wavelength such as an excimer laser beam, the energy density is preferably 80 mJ/cm$^2$ or higher for the reason that the amorphous silicon layer 21 can be sufficiently heated, and the functional layer 14 having excellent crystallizability can be obtained.

Heat generated in the amorphous silicon layer 21, that is, the functional layer 14 by the irradiation of the laser beam LB dissipates toward the substrate 11. However, since the inorganic heat resistant layer 13 having low thermal conductivity is provided between the functional layer 14 and the substrate 11, the heat transmission toward the substrate 11 is suppressed by the inorganic heat resistant layer 13.

By the heat transmitted via the inorganic heat resistant layer 13, the substrate is thermal expanded, and a stress occurs. However, since the organic polymer layer 12 having a thermal expansion coefficient lower than that of the substrate 11 is provided between the inorganic heat resistant layer 13 and the substrate 11, the stress is further shut off. It prevents occurrence of a crack in the functional layer 14 and peeling of the functional layer 14.

After forming the functional layer 14, as shown in FIG. 1, the insulating film 15 is formed on the functional layer 14 by, for example, reactive sputtering. Contact holes corresponding to the source and drain are formed in the insulating film 15 and then the gate electrode 16, source electrode 17, and drain electrode 18 are formed by, for example, vapor deposition.

In the embodiment as described above, the organic polymer layer 12 is formed between the substrate 11 and the functional layer 14. Consequently, even when the laser beam LB is emitted at the time of forming the functional layer 14, the stress which occurs due to the thermal expansion of the substrate 11 is shielded by the organic polymer layer 12, so that occurrence of a crack and peeling in the functional layer 14 can be prevented. Thus, the excellent functional layer 14 made of polysilicon can be formed on the substrate 11 made of an organic material at high yield.

Further, in the embodiment, the thickness increases in accordance with the order of the inorganic heat resistant layer 13, the organic polymer layer 12, and substrate 11. Particularly, the structure is employed in which the inorganic heat resistant layer 13 is formed as thin as possible and the organic polymer layer 12 is formed thicker than the inorganic heat resistant layer 13 and is formed thinner than the substrate 11 in order to be crashworthy without losing flexibility. Thus, the light, shock-resistant thin film transistor 10 having excellent characteristics can be obtained.

Figure 3:
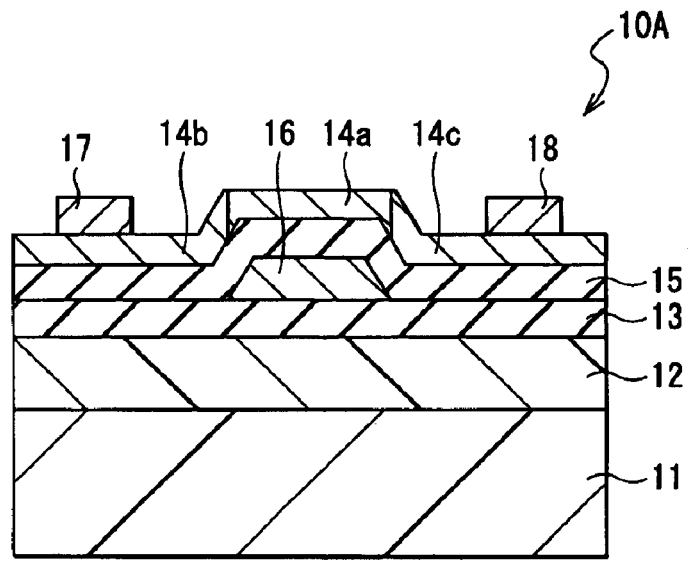
FIG. 3 is a cross section showing a modification of the thin film transistor illustrated in FIG. 1.

Although the thin film transistor 10 in which the channel area 14a, insulating film 15, and gate electrode 16 are provided in this order on the substrate 11 has been described in the foregoing embodiment, as shown in the thin film transistor 10A in FIG. 3, the gate electrode 16, insulating film 15, and channel area 14a may be provided in this order on the substrate 11. In this case as well, effects similar to those of the foregoing embodiment can be obtained.

Second Embodiment

Figure 4:
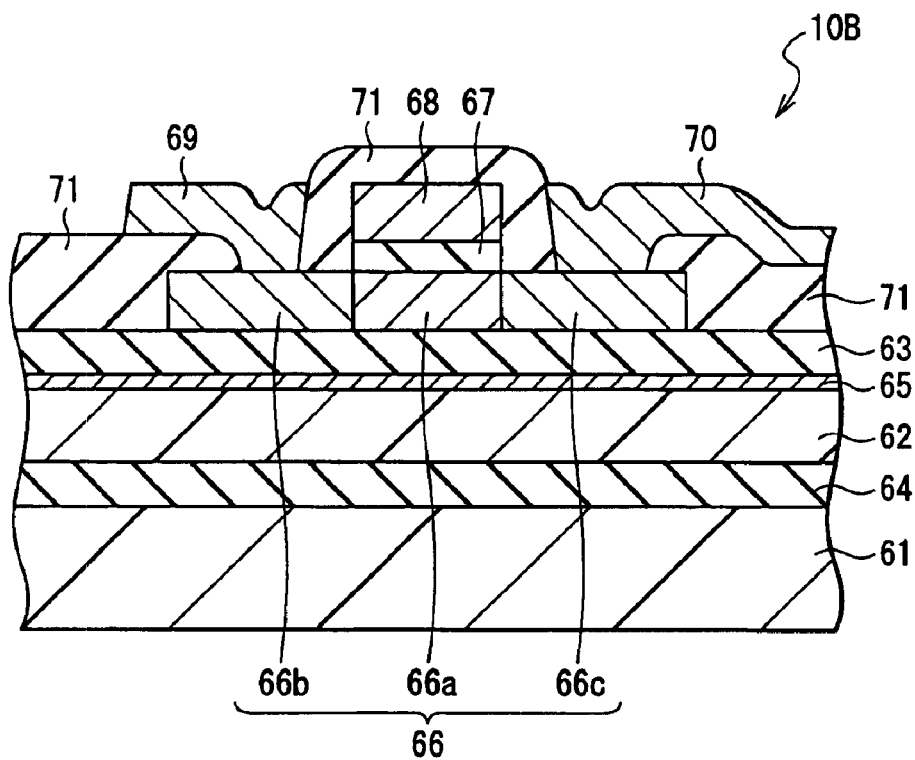
FIG. 4 is a cross section showing the configuration of a thin film transistor according to a second embodiment of the invention.

FIG. 4 shows a sectional configuration of a thin film transistor 10B according to a second embodiment of the invention. In the thin film transistor 10B, for example, between a substrate 61 and a functional layer 66, an inorganic heat resistant layer 64, an organic polymer layer 62, a metal layer 65, and an inorganic heat resistant layer 63 are stacked in order. The inorganic heat resistant layer 63 is provided on the top face of the organic polymer layer 62 in a manner similar to the first embodiment, and the inorganic heat resistant layer 64 is provided on the under face of the organic polymer layer 62. The inorganic heat resistant layers 63 and 64 are made of, for example, similar materials. The functional layer 66 has a channel area 66a, a source area 66b, and a drain area 66c. A gate electrode 68 is formed on the channel area 66a via an insulating film 67, a source electrode 69 is electrically connected to the source area 66b, and a drain electrode 70 is electrically connected to the drain area 66c. The functional layers 66 and the electrodes 68 to 70, and the neighboring functional layer 66 are electrically insulated from each other via an insulating interlayer 71.

Since the substrate 61, organic polymer layer 62, and inorganic heat resistant layers 63 and 64 correspond to the substrate 11, organic polymer layer 12, and inorganic heat resistant layer 13, respectively, in the first embodiment, their detailed description will not be repeated.

The metal layer 65 is made of, for example, a metal having excellent heat conductivity. As a metal material of the metal layer 65, for example, Al is suitably used. Other than Al, Au, Ag, Cu, Pt, Ta, Cr, Mo, W, or the like can be used. The metal layer 65 may have a multilayer structure of two or more layers as the above-described inorganic heat resistant layers 63 and 64. The plurality of metal layers 65 may be properly inserted between the plurality of inorganic heat resistant layers 63 provided on the organic polymer layer 62.

It is also possible to provide one of the inorganic heat resistant layer 64 and metal layer 65.

The functional layer 66, channel area 66a, source area 66b, and drain area 66c correspond to the functional layer 14, channel area 14a, source area 14b, and drain area 14c in the first embodiment, respectively. The insulating film 67, gate electrode 68, source electrode 69, and drain electrode 70 also correspond to the insulating film 15, gate electrode 16, source electrode 17, and drain electrode 18 in the first embodiment, respectively. In addition, in the second embodiment, in order to maintain electrical insulation among the neighboring electrodes 68 to 70 and among the neighboring layers functioning as the functional layer 66, as shown in FIG. 4, the insulating interlayer 71 is provided. The insulating interlayer 71 is made of, for example, a resin material such as silicon oxide or polyimide.

The thin film transistor 10B having such a configuration can be manufactured by a method according to the first embodiment as follows.

First, in a manner similar to the inorganic heat resistant layer 13, the inorganic heat insulating layer 64 is formed on the substrate 61. In a manner similar to the organic polymer layer 12, the organic polymer layer 62 is formed. Subsequently, the metal layer 65 is formed on the organic polymer layer 62 by, for example, DC sputtering. Further, the inorganic heat resistant layer 63 and the functional layer 66 are formed in a manner similar to the inorganic heat resistant layer 13 and the functional layer 14, respectively.

Heat generated in the functional layer 66 by the irradiation of the laser beam LB dissipates toward the substrate 61. However, since the inorganic heat resistant layers 63 and 64 having low heat conductivity are provided between the functional layer 66 and the substrate 61, the heat transmission to the substrate 61 is doubly suppressed by the inorganic heat resistant layers 63 and 64. Further, in the embodiment, since the metal layer 65 having high heat conductivity is provided between the organic polymer layer 62 and the inorganic heat resistant layer 63, heat stored in the inorganic heat resistant layers 63 and 64 dissipates from the metal layer 65.

After forming the functional layer 66, by a known method, the insulating film 67 and the gate electrode 68 are formed on the channel area 66a. After that, for example, the insulating interlayer 71 is formed on the entire face, and contact holes are formed in the insulating interlayer 71. Finally, the source electrode 69 and the drain electrode 70 are formed. In such a manner, the thin film transistor 10A shown in FIG. 4 is obtained.

As described above, according to the embodiment, the inorganic heat resistant layers 63 and 64 having low heat conductivity are provided between the functional layer 66 and the substrate 61, so that the heat transmission to the substrate 61 is doubly suppressed and heat expansion of the substrate 61 can be prevented with reliability. Further, since the metal layer 65 having high heat conductivity is provided between the organic polymer layer 62 and the inorganic heat resistant layer 63, heat accumulated in the heat resistant layers 63 and 64 is dissipated from the metal layer 65, so that heat transmission to the substrate 61 can be prevented. By suppressing the thermal expansion of the substrate 61 more strongly as described above, an effect similar to that of the first embodiment can be enhanced. In other words, heating with an energy beam having higher energy density can be realized.

Third Embodiment

Figure 5:
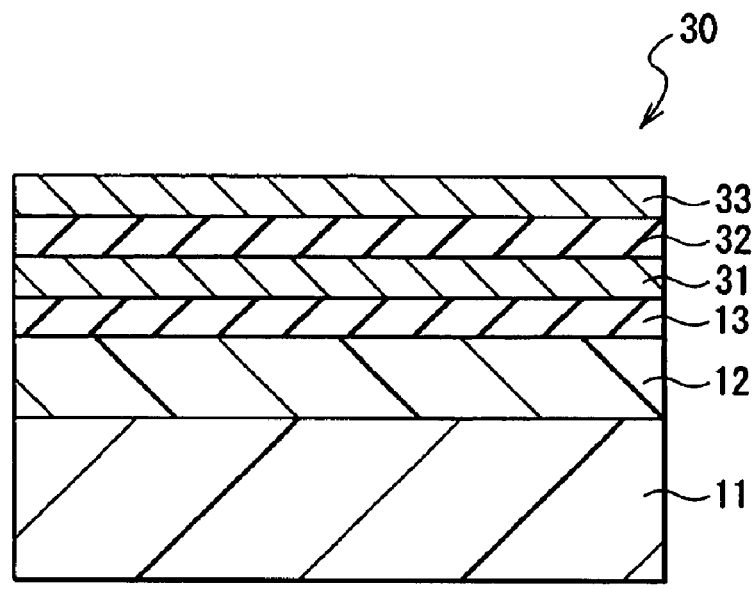
FIG. 5 is a cross section showing the configuration of a dielectric capacitor according to a third embodiment of the invention.

FIG. 5 shows a sectional configuration of a dielectric capacitor 30 according to the second embodiment of the invention. The dielectric capacitor 30 has, in a manner similar to the thin film transistor 10 of the first embodiment, the substrate 11, organic polymer layer 12, and inorganic heat resistant layer 13. The same components are designated by the same reference numerals as those of the first embodiment and their detailed description will not be repeated.

On the inorganic heat resistant layer 13, for example, a lower electrode 31 made of indium tin oxide (ITO), a dielectric layer 32 as a functional layer, and an upper electrode 33 made of ITO are stacked in this order from a side close to the inorganic heat resistant layer 13. The dielectric layer 32 is, for example, polycrystalline and contains a ferroelectric material such as solid solution (PZT) of lead titanate ($PbTiO_3$) and lead zirconate ($PbZrO_3$), barium titanate ($BaTiO_3$), or a layer structure oxide containing bismuth (Bi). Those ferroelectric materials do not have to have stoichiometric composition.

Referring now to FIG. 5, a method of manufacturing the dielectric capacitor 30 having such a configuration will be described.

First, in a manner similar to the first embodiment, the organic polymer layer 12 and the inorganic heat resistant layer 13 are sequentially formed on the substrate 11. Subsequently, on the inorganic heat resistant layer 13, the lower electrode 31 is formed by, for example, sputtering. On the lower electrode 31, an oxide layer mainly in an amorphous state that is not illustrated is formed as a precursor layer of the dielectric layer 32 by, for example, sputtering. On the not-illustrated oxide layer, the upper electrode 33 is formed by, for example, sputtering.

After that, for example, the not-illustrated oxide layer is heated with a laser beam emitted from a side close to the upper electrode 33 in a nitrogen gas atmosphere so as to be crystallized, thereby forming the dielectric layer 32. The parameters of the laser beam are similar to those in the first embodiment. In the third embodiment as well, as described in the first embodiment, heat transmission to the substrate 11 is suppressed by the inorganic heat resistant layer 13, a stress generated by the thermal expansion of the substrate 11 is shut off by the organic polymer layer 12, and occurrence of a crack and peeling in the dielectric layer 32 is prevented.

As described above, in the embodiment as well, the organic polymer layer 12 is formed between the substrate 11 and the dielectric layer 32. Consequently, in a manner similar to the first embodiment, the occurrence of a crack and peeling in the dielectric layer 32 can be prevented, and the excellent dielectric film 32 can be formed on the substrate 11 made of the organic material at high yield. Thus, the light and shock-resistant dielectric capacitor 30 having excellent characteristics can be obtained.

Fourth Embodiment

Figure 6:
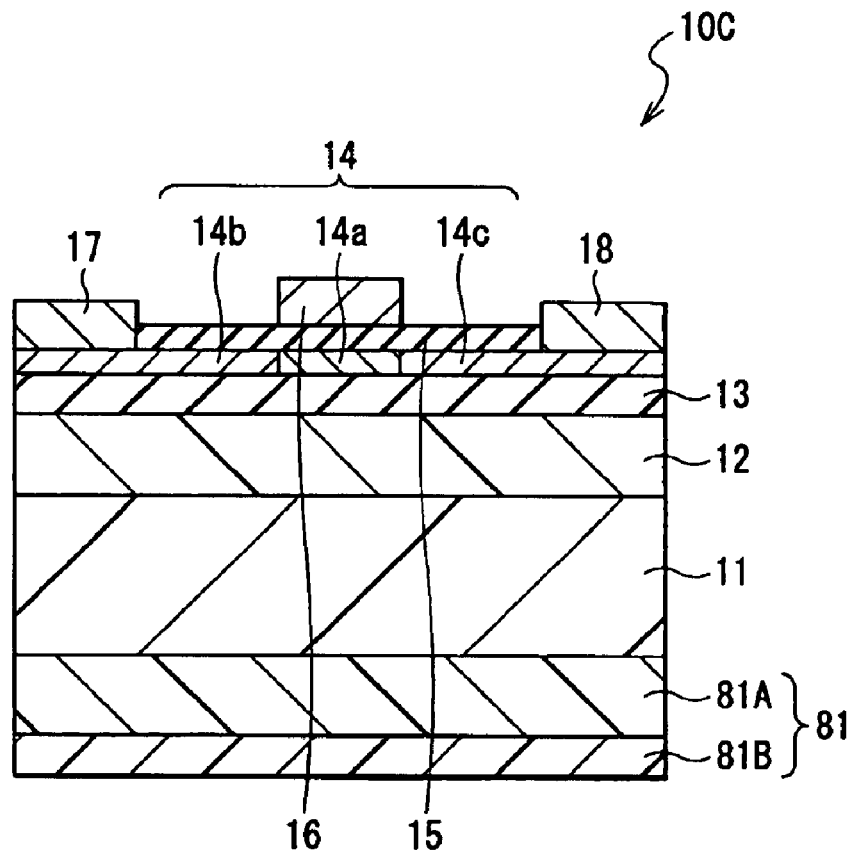
FIG. 6 is a cross section showing the configuration of a thin film transistor according to a fourth embodiment of the invention.

FIG. 6 shows a sectional configuration of a thin film transistor 10C according to a fourth embodiment of the invention. According to the fourth embodiment, on the back side of the substrate 11 of the thin film transistor 10 in the first embodiment, a warp suppression layer 81 for suppressing a warp in the substrate 11 which occurs in association with the thermal expansion is provided. The same components as those in the first embodiment are designated by the same reference numerals and their description will not be repeated. Only different points will be described.

In the fourth embodiment, the warp suppression layer 81 takes the form of a composite layer of a polymer layer 81A made of an organic polymer material and an inorganic heat resistant layer 81B comprised of one or plural layers.

Preferably, the polymer layer 81A is made of the same polymer material as that of the organic polymer layer 12 and is formed with the same thickness as that of the organic polymer layer 12. Preferably, in a manner similar to the inorganic heat resistant layer 13, the inorganic heat resistant layer 81B is also made of a material containing at least one material selected from a group consisting of oxide, nitride, and oxynitride and formed with the same thickness as that of the inorganic heat resistant layer 13. Obviously, the polymer layer 81A and the inorganic heat resistant layer 81B may be made of materials different from those of the organic polymer layer 12 and the inorganic heat resistant layer 13, respectively, as long as any of the above materials is used.

In a following functional layer fabricating process, the following conditions have to be satisfied since it is important to suppress occurrence of a warp in the substrate 11 by a thermal stress by the warp suppression layer 81. Specifically, a thermal displacement ratio in a range from a room temperature to 150° C. is set to 5% or lower at the time point when the warp suppression layer 81 is formed on the back side of the substrate 11 and the organic polymer layer 12 and the inorganic heat resistant layer 13 are formed on the surface of the substrate 11. A thermal displacement ratio in a range from a room temperature to 150° C. is set similarly to 5% or lower at the time point when the functional layer 14 is formed on the surface of the substrate 11. When each of the thermal displacement ratios is 5% or lower, the object can be achieved without a problem in each of the subsequent processes.

The thermal displacement ratio is defined in the specification as "a value calculated by (a/b)×100 where "a" denotes the maximum warp at each of temperatures when one end of the substrate is fixed to a reference face and "b" denotes the maximum length of the substrate". The temperature of 150° C. is set since the temperature is the upper limit from the process point of view when the substrate 11 is made of a plastic material.

In the thin film transistor 10C of the embodiment, in the process (refer to FIG. 2A) of forming the organic polymer layer 12 and the inorganic heat resistant layer 13 on the substrate 11 described in the first embodiment, when the same layers are simultaneously formed on the back side of the substrate 11, the warp suppression layer 81 can be formed. The following processes of forming the amorphous silicon layer 21 and the functional layer 14, emitting the laser beam LB, and the like are similar to those of the first embodiment.

In the fourth embodiment, with the above configuration, in addition to the effect of the first embodiment, an effect such that the warp (curvature) of the substrate 11 caused by a difference in thermal coefficients of expansion between layers such as the substrate 11 and the functional layer 14 can be suppressed is obtained. In the fourth embodiment, the warp suppression layer 81 is constructed by the polymer layer 81A and the heat resistant layer 81B. It is also possible to omit the inorganic heat resistant layer 81B and construct the warp suppression layer 81 only by the polymer layer 81A.

Fifth Embodiment

Figure 7:
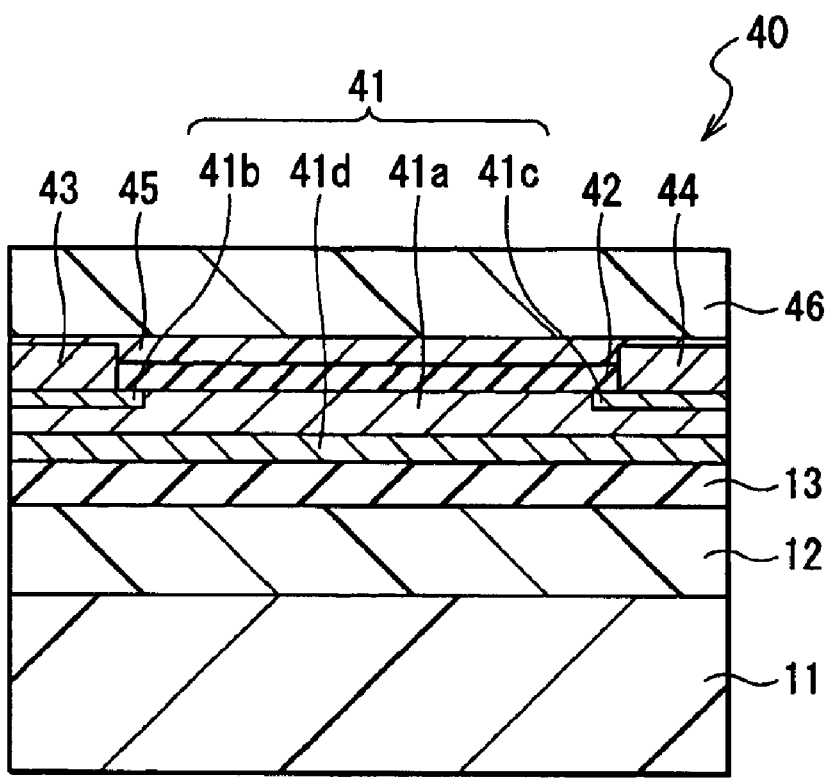
FIG. 7 is a cross section showing the configuration of a solar battery according to a fifth embodiment of the invention.

FIG. 7 shows a sectional configuration of a solar battery 40 according to a fifth embodiment of the invention. The solar battery 40 has, in a manner similar to the thin film transistor 10 of the first embodiment, the substrate 11, organic polymer layer 12, and inorganic heat resistant layer 13. The same components as those in the first embodiment are designated by the same reference numerals and their detailed description will not be repeated.

On the inorganic heat resistant layer 13, for example, a functional layer 41 made of polysilicon is formed. The functional layer 41 has, for example, a p-type area 41a, an $n^+$ type area 41b provided on the p-type area 41a, and a $p^+$ type area 41c provided on the p-type area 41a and isolated from the $n^+$ type area 41b. The p-type area 41a has a thickness of, for example, about 1 µm to 49 µm and contains $1 \times 10^{15}$ to $1 \times 10^{18}$ atoms/cm$^3$ of a p-type impurity such as boron (B). The $n^+$ type area 41b has a thickness of, for example, about 0.05 µm to 1 µm and contains an n-type impurity such as phosphorus at a density as high as about $1 \times 10^{19}$ atoms/cm$^3$. The $p^+$ type area 41c has a thickness of, for example, about 0.05 µm to 1 µm and contains a p-type impurity such as boron at a density as high as about $1 \times 10^{19}$ atoms/cm$^3$.

The functional layer 41 has, for example, under the p-type area 41a, a $p^+$ type area 41d having a thickness of about 1 µm and containing a p-type impurity such as boron at a density as high as about $1 \times 10^{19}$ atoms/cm$^3$. The $p^+$ type area 41d is used to increase the photoelectric conversion efficiency by reflecting electrons generated in the p-type area 41a. By making the functional layer 41 of polysilicon, high doping efficiency is obtained, series resistance can be reduced, and photoelectric conversion efficiency can be increased.

On the functional layer 41, for example, an antireflection film 42 made of titanium oxide ($TiO_2$) is formed. An opening is formed in the antireflection film 42 in correspondence with the $n^+$ type area 41b, and a cathode 43 made of, for example, aluminum is electrically connected to the $n^+$ type area 41b via the opening. An opening corresponding to the $p^+$ type area 41c is also formed in the antireflection film 42, and an anode 44 made of, for example, aluminum is electrically connected to the $p^+$ type area 41c via the opening. On the antireflection film 42, cathode 43, and anode 44, for example, a protective substrate 46 made of polyethylene terephthalate is disposed via an adhesion layer 45 made of ethylene-vinylacetate.

Figure 8:
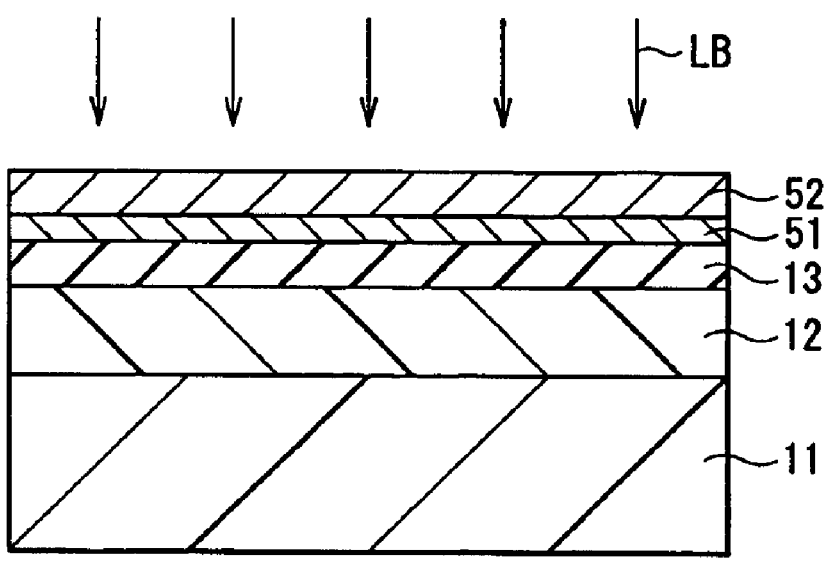
FIG. 8 is a cross section for explaining a manufacturing process of the solar battery shown in FIG. 7.
Figure 9:
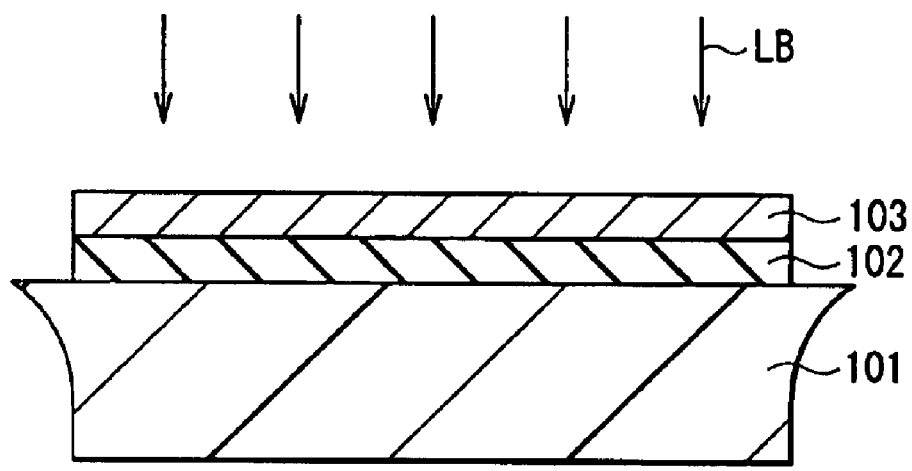
FIG. 9 is a cross section for explaining conventional problems.

Referring now to FIGS. 7 and 8, a method of manufacturing the solar battery 40 will be described.

First, as shown in FIG. 8, in a manner similar to the first embodiment, the organic polymer layer 12 and the inorganic heat resistant layer 13 are sequentially formed on the substrate 11. On the inorganic heat resistant layer 13, an amorphous silicon layer 51 is formed as a precursor layer of the functional layer 41 by, for example, sputtering. The amorphous silicon layer 51 is exposed, for example, in an atmosphere containing an ionized gas of diborane ($B_2H_6$), and boron (B) is doped.

On the amorphous silicon layer 51, for example, by sputtering, an amorphous silicon layer 52 is further formed as a precursor layer of the functional layer 41. After that, for example, a side close to the amorphous silicon layer 52 is irradiated with the laser beam LB in the nitrogen gas atmosphere to thereby heat the amorphous silicon layers 51 and 52. By the operation, the amorphous silicon layers 51 and 52 are crystallized and become the functional layer 41. In this case, a portion corresponding to the amorphous silicon layer 51 becomes the $p^+$ type area 41d. The parameters of the laser beam are similar to those in the first embodiment. In the fifth embodiment as well, as described in the first embodiment, heat transmission to the substrate 11 is suppressed by the inorganic heat resistant layer 13, the stress generated by thermal expansion of the substrate 11 is shut off by the organic polymer layer 12, and occurrence of a crack and peeling is prevented.

As shown in FIG. 7, a part corresponding to the amorphous silicon layer 52 in the functional layer 41 is exposed to, for example, an atmosphere of an ionized gas of diborane, thereby forming the p-type area 41a. After that, for example, by using the lithography technique, a part of the p-type area 41a is exposed to the atmosphere containing the ionized gas of diborane to form the $p^+$ type area 41c. Further, for example, by using the lithography technique, a part of the p-type area 41a is exposed to an atmosphere containing an ionized gas of phosphine, thereby forming the $n^+$ type area 41b.

After forming the functional layer 41 as described above, on the functional layer 41, the antireflection film 42 is formed by, for example, sputtering, and openings are formed in correspondence with the $n^+$ type area 41b and the $p^+$ type area 41c. After that, for example, by sputtering, the cathode 43 and the anode 44 are formed in correspondence with the $n^+$ type area 41b and the $p^+$ type area 41c, respectively. Finally, on the antireflection film 42, the protective substrate 46 is adhered via the adhesive layer 45.

In the embodiment as well, the organic polymer layer 12 is formed between the substrate 11 and the functional layer 41. In a manner similar to the first embodiment, the occurrence of a crack and peeling in the functional layer 41 can be prevented, so that the excellent functional layer 41 made of polysilicon can be formed on the substrate 11 made of an organic material at high yield. Therefore, the light, shock-resistant solar battery 40 having excellent characteristics can be easily obtained.

Further, concrete examples of the invention will be described in detail.

EXAMPLE 1

In Example 1, first, a substrate having a thickness of 200 $\mu$m made of polyethylene terephthalate was prepared. On the substrate, an organic polymer layer was formed by applying dipentaerithritol to a thickness of about 6 $\mu$m and irradiating the material with ultraviolet rays to carry out condensation polymerization into a three-dimensional structure. After that, the substrate on which the organic polymer layer is formed was stamped in a disk shape having a diameter of about 10 cm, washed, and dried.

Subsequently, the substrate was disposed in a vacuum chamber, and the pressure in the chamber was set to about $1.3 \times 10^{-5}$ Pa by using a vacuum pump. After that, oxygen gas ($O_2$) and argon gas (Ar) were charged into the chamber, and an inorganic heat resistant layer made of silicon oxide was formed on the organic polymer layer to a thickness of about 300 nm by reactive sputtering. After forming the inorganic heat resistant layer, argon gas was passed into the chamber and an amorphous silicon layer as a precursor layer was formed on the inorganic heat resistant layer to a thickness of about 30 nm by sputtering. To form the inorganic heat resistant layer and the amorphous silicon layer, a facing target system for applying a voltage between targets disposed on one side of the substrate was used.

After forming the amorphous silicon layer, the substrate was taken out from the vacuum chamber, the amorphous silicon layer was irradiated with a line beam of an XeCl excimer laser with an energy density of 280 mJ/cm$^2$ at the maximum in the nitrogen gas atmosphere and crystallized, thereby forming a polysilicon layer as the functional layer. After that, the polysilicon layer was observed at a magnification of 90 times by an optical microscope. No crack and peeling was seen in the polysilicon layer, and an excellent crystal layer was formed.

As a comparative example of Example 1, except that the organic polymer layer is not formed, the polysilicon layer was formed in a manner similar to Example 1. The polysilicon layer was also observed in a manner similar to Example 1. A number of cracks were seen in the polysilicon layer and a part was completely peeled off.

It was understood that, by forming the organic polymer layer between the substrate and the amorphous silicon layer, even if the amorphous silicon layer is irradiated with a laser beam, an excellent polysilicon layer can be formed on the substrate made of an organic material without causing a crack and peeling.

EXAMPLE 2

In this example, a polysilicon layer was formed in a manner similar to Example 1 except that an electrode made of ITO was formed between the inorganic heat resistant layer and the amorphous silicon layer. The polysilicon layer was also observed in a manner similar to Example 1. No crack and peeling was seen in the polysilicon layer and an excellent crystal layer was formed.

EXAMPLE 3

In this example, a polysilicon layer was formed in a manner similar to Example 1 except that after forming the amorphous silicon layer, prior to irradiation of a laser beam, phosphorus was doped at a high density into the amorphous silicon layer. After carrying the substrate into a PECVD (Plasma Enhanced Chemical Vapor Deposition) chamber by using a load lock, the phosphorus was doped by exposing the amorphous silicon layer to a plasma while passing a mixture gas of phosphine gas and hydrogen gas (Hs) containing 1% by volume of phosphine gas. The polysilicon layer was also observed in a manner similar to Example 1 and no cracks and peeling were found. It was understood that the excellent $n^+$ type polysilicon layer can be formed on the substrate made of an organic material.

EXAMPLE 4

In this example, a polysilicon layer was formed in a manner similar to Example 1 except that, after forming the amorphous silicon layer, boron was doped at high density into the amorphous silicon layer prior to irradiation of a laser beam. Boron was doped in a manner similar to Example 3 except that a diborane gas was used in place of a phosphine gas. The polysilicon layer was also observed in a manner similar to Example 1 and no cracks and peeling were seen. That is, it was understood that the excellent $p^+$ type polysilicon layer can be formed on the substrate made of an organic material.

EXAMPLE 5

In this example, first, in a manner similar to Example 1, the organic polymer layer and the inorganic heat resistant layer were sequentially formed on the substrate. Subsequently, in an argon gas atmosphere, a lower electrode made of ITO was formed on the inorganic heat resistant layer by sputtering. On the lower electrode, a mainly amorphous-state oxide layer containing lead (Pb), titanium (Ti), and zirconium (Zr) was formed as a precursor layer by sputtering in the argon gas atmosphere at a room temperature. After that, in the argon gas atmosphere, an upper electrode made of ITO was formed on the oxide layer by sputtering. For formation of the lower electrode, oxide layer, and upper electrode, the facing target system was used.

After forming the upper electrode, a side close to the upper electrode was irradiated with a line beam of an XeCl excimer laser at an energy density of 280 mJ/cm$^2$ at the maximum in a nitrogen gas atmosphere, the oxide layer was crystallized, and a dielectric layer was formed as a functional layer containing a polycrystal PZT. The dielectric layer was observed in a manner similar to Example 1 and no cracks and peeling were seen. That is, it was understood that the excellent dielectric layer can be formed on the substrate made of an organic material.

EXAMPLE 6

In this example, a $p^+$ type polysilicon layer was formed in a manner similar to Example 4 except that dipentaerythritol (warp suppression layer) was applied to 6 $\mu$m on the back face of a substrate made of PET (polyethylene terephthalate), having a thickness of 200 $\mu$m, and having a length of 10 cm. When the polysilicon layer was observed in a manner similar to Example 1, no cracks and peeling were seen. That is, it could be confirmed that an effect similar to that of Example 4 can be obtained also in the case where the warp suppression layer is formed on the back of the substrate.

EXAMPLE 7

In this example, a polysilicon layer was formed in a manner similar to Example 1 except that a composite polymer material of polyacrylic ester and phenoxy resin was applied to a thickness of about 8 $\mu$m. The polysilicon layer was observed in a manner similar to Example 1, and no cracks and peeling were seen. That is, it could be confirmed that an effect similar to that of Example 1 can be obtained also in the case where the organic polymer layer is made of the other material.

EXAMPLE 8

A polysilicon layer was formed in a manner similar to Example 2 except that a composite polymer material of polyacrylic ester and phenoxy resin was applied to a thickness of about 8 $\mu$m. The polysilicon layer was observed in a manner similar to Example 1, and no cracks and peeling were seen. That is, it could be confirmed that an effect similar to that of Example 2 can be obtained also in the case where the organic polymer layer is made of the other material.

EXAMPLE 9

A $n^+$ type polysilicon layer was formed in a manner similar to Example 3 except that a composite polymer material of polyacrylic ester and phenoxy resin was applied to a thickness of about 8 $\mu$m. The polysilicon layer was observed in a manner similar to Example 1, and no cracks and peeling were seen. That is, it could be confirmed that an effect similar to that of Example 3 can be obtained also in the case where the organic polymer layer is made of the other material.

EXAMPLE 10

A $p^+$ type polysilicon layer was formed in a manner similar to Example 4 except that a composite polymer material of polyacrylic ester and phenoxy resin was applied to a thickness of about 8 $\mu$m. The polysilicon layer was observed in a manner similar to Example 1, and no cracks and peeling were seen. That is, it could be confirmed that an effect similar to that of Example 4 can be obtained also in the case where the organic polymer layer is made of the other material.

EXAMPLE 11

A $p^+$ type polysilicon layer was formed in a manner similar to Example 10 except that a composite polymer material of polyacrylic ester and phenoxy resin was applied to a thickness of 8 $\mu$m on the back face of a substrate made of PET (polyethylene terephthalate), having a thickness of 200 $\mu$m, and a length of 10 cm. The polysilicon layer was observed in a manner similar to Example 1, and no cracks and peeling were seen. That is, it could be confirmed that an effect similar to that of Example 10 can be obtained also in the case where the warp suppression layer is formed on the back of the substrate.

Although the present invention has been described above by the embodiments and examples, the invention is not limited to the foregoing embodiments and examples but can be variously modified. For example, the case where the functional layers 14 and 41 are made of silicon has been described in the first and third embodiments. The functional layers 14 and 41 may be made of another semiconductor containing silicon such as silicon germanium. The invention can be also applied to a case where the functional layer is made of other semiconductor such as III–V compound semiconductor.

Further, in the second embodiment, the example where the dielectric layer 32 is made of a ferroelectric material has been described. Alternately, the dielectric layer 32 may be made of a high dielectric material.

Further, in the foregoing embodiments and examples, the functional layer is made of polycrystal. However, the invention can be widely applied also to the case where the functional layer is in a crystalline state of single crystal, crystallite, or the like. That is, the invention can be widely applied to the case where the functional layer has crystallinity. The functional layer may be crystalline in at least a part like a composite body of polycrystal and amorphous substance.

In addition, the foregoing embodiments and examples have been described with respect to the case where the inorganic heat resistant layer is made of silicon oxide, silicon nitride, or silicon oxynitride. Instead of the materials or together with the materials, at least one of oxide, nitride, or oxynitride of, for example, aluminum, zirconium, or the like may be contained.

Further, in the foregoing embodiments and examples, the precursor layer is irradiated with a laser beam. Alternately, other energy beams such as electron beam may be used.

Moreover, although the functional device has been concretely described as an example in the foregoing embodiments, the invention can be widely applied to a functional device with the other configuration as long as the functional device has an inorganic heat resistant layer between a substrate and a functional layer and has an organic polymer layer between the inorganic heat resistant layer and the substrate. For example, the invention can be also applied to memories such as FeRAM (Ferroelectric Random Access Memories) and functional devices other than a dielectric capacitor having a functional layer containing an oxide.

Further, although the embodiments have been described with respect to the functional device having the substrate 11, the substrate 11 may be removed after fabricating the functional device. The invention can be applied also to a functional device which does not have the substrate 11.

As described above, in the functional device or the method of manufacturing the functional device according to the invention, the organic polymer layer having a thermal expansion coefficient lower than that of the substrate is provided between the functional layer and the substrate. Consequently, for example, even when an energy beam is emitted to form the functional layer, the stress generated by the thermal expansion of the substrate can be shut off by the organic polymer layer, so that occurrence of cracks and peeling in the functional layer can be prevented. Thus, effects are produced such that the light, shock-resistant functional device having excellent characteristics and capable of using the substrate made of, for example, an organic material can be obtained.

Further, in the invention, by providing the warp suppression layer on the face of the substrate opposite to the face on which the functional layer is provided, a warp caused by thermal deformation of the substrate can be effectively suppressed.

In the functional device according to another aspect of the invention, since the organic polymer layer is provided on one of the faces of the functional layer, even when the energy beam is irradiated to form the functional layer, the stress generated by the thermal expansion can be shut off by the organic polymer layer, so that the occurrence of cracks and peeling in the functional layer can be prevented. Therefore, the substrate made of an organic material having a high thermal expansion coefficient can be used at the time of manufacture.

Obviously many modifications and variations of the present invention are possible in the light of the above teachings. It is therefore to be understood that within the scope of the appended claims the invention may be practiced otherwise than as specifically described.

What is claimed is:

1. A functional device in which a functional layer is provided on one of faces of a substrate, comprising:
   an inorganic heat resistant layer which consists of one or a plurality of inorganic compound layers provided between the substrate and the functional layer; and
   an organic polymer layer lower in thermal expansion coefficient than the substrate provided between the inorganic heat resistant layer and the substrate.

2. A functional device according to claim 1, wherein the thickness of each layers increases in accordance with order of the inorganic heat resistant layer, the organic polymer layer, and the substrate.

3. A functional device according to claim 1, further comprising another inorganic heat resistant layer which is different from the inorganic heat resistant layer and consists of one or a plurality of inorganic heat resistant layers provided between the substrate and the organic polymer layer.

4. A functional device according to claim 3, wherein each of the inorganic heat resistant layer and the another inorganic heat resistant layer has thermal conductivity lower than that of the functional layer.

5. A functional device according to claim 3, wherein each of the inorganic heat resistant layer and the another inorganic heat resistant layer has thermal expansion coefficient lower than that of the organic polymer layer.

6. A functional device according to claim 3, wherein each of the inorganic heat resistant layer and the another inorganic heat resistant layer includes at least one kind of material selected from the group of an oxide, a nitride, and an oxynitride.

7. A functional device according to claim 3, wherein each of the inorganic heat resistant layer and the another inorganic heat resistant layer is made of an inorganic carbide or a carbon material.

8. A functional device according to claim 1, further comprising a metal layer which consists of one or a plurality of layers provided between the organic polymer layer and the inorganic heat resistant layer.

9. A functional device according to claim 1, wherein the organic polymer layer is made of an acrylic resin, an epoxy resin, or a polymer material containing the acrylic resin or the epoxy resin.

10. A functional device according to claim 1, wherein the functional layer has crystallinity.

11. A functional device according to claim 1, wherein the functional layer contains a semiconductor or an oxide.

12. A functional device according to claim 1, wherein the functional layer contains silicon.

13. A functional device according to claim 1, further comprising an electrode for the functional layer, provided between the functional layer and the inorganic heat resistant layer.

14. A functional device from which a substrate is removed after a functional layer is provided on one of faces of the substrate, comprising:
   an organic polymer layer lower in thermal expansion coefficient than the substrate provided on one of faces of the functional layer; and
   an inorganic heat resistant layer which consists of one or a plurality of layers provided between the organic polymer layer and the functional layer.

15. A functional device according to claim 14, further comprising another inorganic heat resistant layer which is different from the inorganic heat resistant layer and which consists of one or a plurality of layers provided between the substrate and the organic polymer layer.

16. A functional device according to claim 14, further comprising a metal layer which consists of one or a plurality of layers provided between the organic polymer layer and the inorganic heat resistant layer.

17. A method of manufacturing a functional device in which a functional layer is provided on a substrate, comprising:
   a step of forming an organic polymer layer having a thermal expansion coefficient lower than that of the substrate on the substrate;

a step of forming an inorganic heat resistant layer which consists of one or a plurality of layers on the organic polymer layer; and a step of forming the functional layer on the inorganic heat resistant layer.

18. A method of manufacturing a functional device according to claim 17, further comprising a step of forming another heat resistant layer on the substrate, which is different from the heat resistant layer and consists of one or a plurality of layers before the organic polymer layer is formed.

19. A method of manufacturing a functional device according to claim 17, further comprising a step of forming a metal layer which consists of one or a plurality of layers on the organic polymer layer before the heat resistant layer is formed.

20. A method of manufacturing a functional device according to claim 17, wherein the step of forming the organic polymer layer includes:

a step of forming a precursor of the organic polymer layer; and a step of forming an organic polymer layer by irradiating the precursor with an energy beam to make condensation polymerization occur in the organic polymer layer.

21. A method of manufacturing a functional device according to claim 20, wherein the energy beam is emitted from an ultraviolet lamp including a wavelength of an ultraviolet region.

22. A method of manufacturing a functional device according to claim 17, wherein the step of forming the functional layer includes:

a step of forming a precursor of the functional layer; and a step of forming the functional layer by irradiating the precursor with an energy beam.

23. A method of manufacturing a functional device according to claim 22, wherein the precursor is crystallized by irradiating an energy beam.

24. A method of manufacturing a functional device according to claim 22, wherein a laser beam is used as the energy beam.

25. A method of manufacturing a functional device according to claim 24, wherein a laser beam of a short wavelength having an energy density of 80 mJ/cm$^2$ or higher is applied as the laser beam.

26. A functional device in which a functional layer is provided on one of faces of a substrate, comprising:

an inorganic heat resistant layer which consists of one or a plurality of layers provided between the substrate and the functional layer;

an organic polymer layer lower in thermal expansion coefficient than the substrate provided between the inorganic heat resistant layer and the substrate; and a warp suppression layer for suppressing a warp of the substrate provided on a face facing the face on which the functional layer is provided.

27. A functional device according to claim 26, wherein the warp suppression layer is made of an organic polymer material.

28. A functional device according to claim 26, wherein the warp suppression layer is a composite layer comprised of a polymer layer made of an organic polymer material and an inorganic heat resistant layer which consists of one or two or more layers.

29. A functional device according to claim 27 or 28, wherein the organic polymer material is an acrylic resin, an epoxy resin or a material containing the acrylic resin or the epoxy resin.

30. A functional device according to claim 28, wherein the inorganic heat resistant layer contains at least one kind of material selected from a group of an oxide, a nitride, and an oxynitride.

31. A functional device according to claim 28, wherein each of the inorganic heat resistant layer is made of an inorganic carbide or a carbon material.

32. A method of manufacturing a functional device in which a functional layer is provided on a substrate, comprising:

a step of forming a warp suppress layer for suppressing a warp in the substrate on the back side of the substrate;

a step of forming an organic polymer layer having a thermal expansion coefficient lower than that of the substrate on the surface of the substrate;

a step of forming an inorganic heat resistant layer which consists of one or a plurality of layers on the organic polymer layer; and a step of forming the functional layer on the inorganic heat resistant layer.

33. A method of manufacturing a functional device according to claim 32, wherein a thermal displacement ratio in a range from a room temperature to 150° C. is set to 5% or lower at the time point when the warp suppression layer is formed on the back side of the substrate and the organic polymer layer and the inorganic resistant layer are formed on the surface of the substrate.

34. A method of manufacturing a functional device according to claim 32, wherein a thermal displacement ratio in a range from a room temperature to 150° C. is set to 5% or lower at the time point when the warp suppression layer is formed on the back side of the substrate, and the organic polymer layer, the inorganic heat resistant layer, and the functional layer are formed on the surface of the substrate.

35. A method of manufacturing a functional device according to claim 32, further comprising a step of forming a metal layer which consists of one or a plurality of layers on the organic polymer layer before the inorganic heat resistant layer is formed.

36. A method of manufacturing a functional device according to claim 32, wherein the step of forming the organic polymer layer includes:

a step of forming a precursor of the organic polymer layer; and a step of forming the organic polymer layer by irradiating the precursor with an energy beam to make condensation polymerization occur in the organic polymer.

37. A method of manufacturing a functional device according to claim 36, wherein the energy beam is emitted from an ultraviolet lamp including a wavelength of an ultraviolet region.

38. A method of manufacturing a functional device according to claim 32, wherein the step of forming the functional layer includes:

a step of forming a precursor layer of the functional layer on the inorganic heat resistant layer; and a step of forming the functional layer by irradiating the precursor layer with an energy beam.

39. A method of manufacturing a functional device according to claim 38, wherein the precursor layer is crystallized by irradiating an energy beam.

40. A method of manufacturing a functional device according to claim 39, wherein a laser beam is used as the energy beam.

41. A method of manufacturing a functional device according to claim 40, wherein a laser beam of a short wavelength having an energy density of 80 mJ/cm$^2$ or higher is applied as the laser beam.

42. A method of manufacturing a functional device according to claim 32, further comprising a step of forming an electrode for the functional layer between the inorganic heat resistant layer and the functional layer.

* * * * *